United States Patent [19]

Fujii et al.

[11] Patent Number: 4,980,204
[45] Date of Patent: Dec. 25, 1990

[54] METAL ORGANIC CHEMICAL VAPOR DEPOSITION METHOD WITH CONTROLLED GAS FLOW RATE

[75] Inventors: Takuya Fujii, Isehara; Susumu Yamazaki, Hadano, both of Japan

[73] Assignee: Fujitsu Limited, Kawasaki, Japan

[21] Appl. No.: 271,278

[22] Filed: Nov. 15, 1988

[30] Foreign Application Priority Data

Nov. 27, 1987 [JP] Japan .................................. 62-299158
Sep. 30, 1988 [JP] Japan .................................. 63-248311

[51] Int. Cl.$^5$ .......................................... C23C 16/00
[52] U.S. Cl. ................................... 427/255.2; 118/715;
118/724; 118/725; 118/730; 156/611;
427/248.1; 427/255; 427/255.1; 427/255.5;
437/225; 437/228; 437/233; 437/234
[58] Field of Search ............... 118/715, 724, 725, 730;
427/255, 255.1, 255.2, 255.5, 248.1; 437/225,
228, 233, 234; 156/611

[56] References Cited

U.S. PATENT DOCUMENTS

| | | | |
|---|---|---|---|
| 3,511,703 | 5/1970 | Peterson | 427/255.5 |
| 4,105,810 | 8/1978 | Yamazaki et al. | 427/255.3 |
| 4,369,031 | 1/1983 | Goldman et al. | 118/715 |
| 4,508,054 | 4/1985 | Baumberger et al. | 118/715 |
| 4,673,799 | 6/1987 | Mahawili | 118/725 |
| 4,838,201 | 6/1989 | Fraas et al. | 118/715 |
| 4,844,950 | 7/1989 | Saitoh et al. | 427/255.1 |

FOREIGN PATENT DOCUMENTS

| | | | |
|---|---|---|---|
| 62-133070 | 6/1987 | Japan | 118/715 |
| 62-262419 | 11/1987 | Japan | 118/723 |
| 63-57775 | 3/1988 | Japan | 118/715 |
| 63-257232 | 10/1988 | Japan | 118/715 |

OTHER PUBLICATIONS

Oishi, Mamoru and Koichi Kuroiwa, "Metalorganic VPE of InGaAs on InP", Jpn. J. Appl. Phys., vol. 21, No. 1, (Jan. 1982), pp. 203-204.
Patents Abstracts of Japan, vol. 8, No. 150, (C-233) [1587], Jul. 12, 1984; and JP-A-59 55 343 (Suwa Seikosha) 30-03-1984.
Patent Abstracts of Japan, vol. 8, No. 7, (C-204) [1444], Jan. 12, 1984; and JP-A-58 176 196 (Matsushita Denki Sangyo) 15-10-1983.
Patent Abstracts of Japan, vol. 10, No. 32, (E-379) [2089], Feb. 7, 1986; and JP-A-60 189 928 (Fujitsu) 27-09-1985.

Primary Examiner—Norman Morgenstern
Assistant Examiner—Terry Owens
Attorney, Agent, or Firm—Staas & Halsey

[57] ABSTRACT

An apparatus for growing a compound semiconductor layer by metal organic chemical vapor deposition (MOCVD) is disclosed. Utilizing the apparatus, the semiconductor layer of uniform thickness and uniform composition can be grown. The apparatus includes a plurality of vent pipes which spout a mixed gas of source material gases and a dilution gas into a reactor chamber, vertical to a substrate surface. The apparatus also includes a gas supply system in which a gas flow rate through each vent pipe is made to be controllable individually by a flow controlling device. In addition, a controller is operatively connected to the flow controlling devices, so that automatic growth of a semiconductor layer of a high quality can be achieved. When two source material gases used are mutually too reactive and deposits are formed within the gas supply system, two separate gas supply systems for these two gases are demonstrated to be effective. Another embodiment which enables individual control of concentration of the source material gas and the gas flow rate through each vent pipe, is also disclosed.

6 Claims, 8 Drawing Sheets

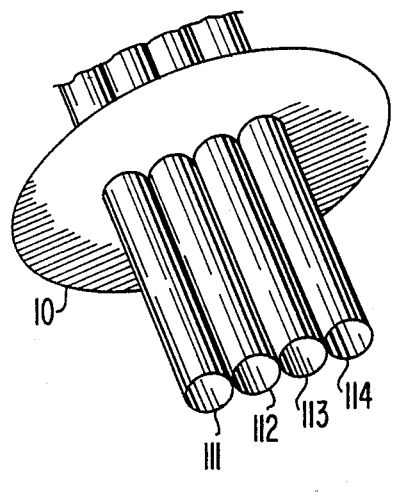
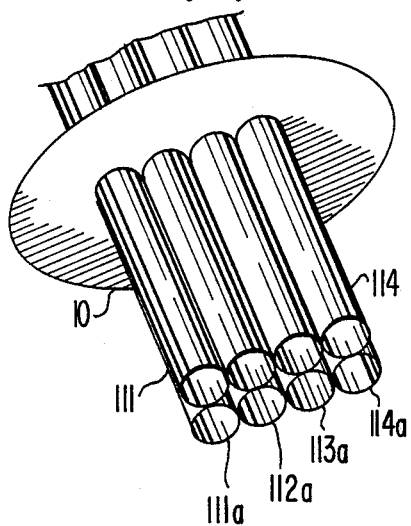
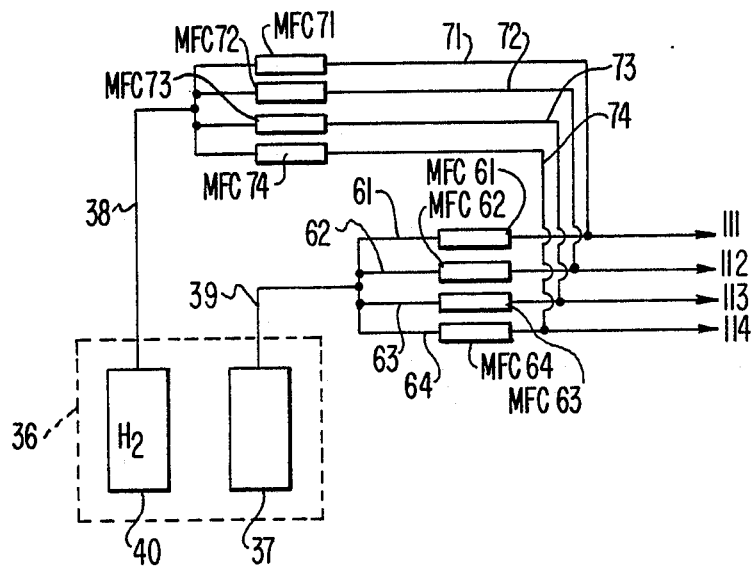

METAL ORGANIC CHEMICAL VAPOR DEPOSITION METHOD WITH CONTROLLED GAS FLOW RATE

BACKGROUND OF THE INVENTION

1. Field of the Invention

This invention relates to an apparatus used for metal organic chemical vapor deposition (hereinafter, abbreviated as MOCVD) and a method using the same. Particularly, this invention concerns the apparatus and the method for growing a compound semiconductor layer on a substrate. This invention has a particular applicability in connection with an apparatus, in which a metal organic gas and a reactive gas are source material gases and a hydrogen gas is used as a dilution gas.

2. Description of the Related Art

An MOCVD method is widely used when a compound semiconductor such as a group III-V or II-VI binary, ternary, or quaternary semiconductor is grown on a semiconductor substrate. In the MOCVD method, a compound gas composed of metal and methyl (or ethyl) group is used as one of source material gases, and is fed to a reactor chamber bubbled with a hydrogen gas. MOCVD is sometimes called MOVPE (metal organic vapor phase epitaxy), however, a word "MOCVD" is used hereinafter in the present invention.

A horizontal or vertical type is used for a reactor chamber in the MOCVD method. In FIG. 1, an MOCVD apparatus is schematically shown when a vertical type reactor chamber is used. A horizontal type reactor chamber is more suitable than the vertical type when plural wafers are processed at a time. However, when uniformity in thickness or composition of a grown compound semiconductor layer is important, the vertical type MOCVD apparatus has many advantages for these purposes In FIG. 1, a plurality of source material gases and a hydrogen dilution gas are mixed and fed into a reactor chamber 5 through a main valve $V_m$ and a vent pipe 1. The vent pipe 1 is sealed to an upper wall portion of the reactor chamber 5 and broadens toward its opening 101. A wafer or a substrate 2 is loaded on a susceptor 8, which is rotated around a support axis 7 during operation, and the substrate is located at position opposed to the opening 101. The vent pipe 1 has a reversed funnel-like shape and functions to make gas flow more uniform onto the surface of the substrate 2. The susceptor 8 is made of carbon material and is heated by a high frequency induction coil 17 in order to raise a substrate temperature up to a specified value. The used gas is finally discharged through an opening 6.

A plurality of material gas sources 41 to 43 is provided and mixed through valves $V_1$, $V_2$ and $V_3$. In FIG. 1, three source material gas sources are representatively shown. Generally, a hydrogen dilution gas source 40 is provided and the hydrogen ($H_2$) gas is supplied through a valve $V_0$ and mixed with source material gases in order to control gas flow rate and obtain uniformly mixed gas. Each source material gas is provided in either a bombe containing a source material gas or in a bubbler containing a metal organic compound source in a liquid or solid phase which is bubbled by a hydrogen gas. For example, when a ternary semiconductor GaAsP or InGaAs is grown on a binary semiconductor substrate of GaAs or InP respectively, three material gas sources are provided. As an indium gas source, trimethylindium $(In(CH_3)_3)$ is provided in a bubbler, and as a gallium gas source, trimethylgallium $(Ga(CH_3)_3)$ is provided in a bubbler. An arsenic or phosphorus gas source, such as arsine [$AsH_3$] or phosphine [$PH_3$] gas, is provided in a bombe.

In order to use these metal organic gas sources, a bubbler containing the metal organic compound is bubbled with a hydrogen gas. The quantity of the metal organic compound output from the bubbler is controlled by an inside temperature of the bubbler and the flow rate of the bubbling hydrogen gas. On the other hand, the arsine or phosphine gas from the bombe is also mixed with a hydrogen gas in order to increase a flow velocity in pipe lines. In growing a III-V group semiconductor layer, a ratio of the V group source material to the III group source material in the mixed gas is maintained at a suitable value in order to obtain a proper growth rate and a proper mixing ratio of the grown mixed semiconductor, and these factors change depending on the kinds of the semiconductor layer to be grown. In order to control the growth process easily and obtain a uniform mixture of source material gases, the mixed gas of these source material gases is further diluted by a hydrogen gas from the dilution gas source 40 and thereafter fed to the reactor chamber 5.

The most important factor in growing a compound semiconductor layer on a substrate is that a uniform thickness of the grown layer is obtained over the entire surface of the substrate and further, when the grown semiconductor is a mixed compound semiconductor, the mixing ratio thereof is also uniform on the substrate surface as much as possible. The latter condition can be expressed in other words that the grown semiconductor, for example, $In_{1-x}Ga_xAs$ or $In_{1-x}Ga_xAs_yP_{1-y}$ has an almost constant x-value or (x, y)-value over the entire substrate surface.

However, in an application of the MOCVD apparatus shown in FIG. 1, though it has the vent pipe 1 which has the enlarged opening 101 at a spouting side of gas into the reactor chamber in order to get more uniform gas flow onto the substrate surface, it is a difficult matter to get a uniform thickness of the grown layer over the entire substrate surface and also a uniform composition thereof. To improve the uniformity of gas flow, a vent pipe 1 shown in FIG. 2 is proposed. The vent pipe 1 has plural branched pipes 3 at the spouting side thereof. The MOCVD apparatus utilizing the vent pipe such as shown in FIG. 2 is effective to some extent, however, it needs a vent pipe 1 with branched pipes 3 having a different diameter and a different shape. And moreover, when the gas flow rate, the growth temperature, etc. or the kinds of gases are changed, another type of the vent pipe must be provided, which has branched pipes with a different diameter in order to get uniform growth on the substrate. It is a difficult and practically impossible matter to change the vent pipe during the growing process in order to obtain a different semiconductor layer.

Other improvements for obtaining uniformity of the grown semiconductor layer, especially, with regard to the vertical type MOCVD apparatus are disclosed in the following Japanese Unexamined Patent Publication: Nos. SHO-58-176196 dated Oct. 15, 1983, by A. Takamori et al. SHO-60-189928 dated Sept. 27, 1985, by Y. Shiotani The above two disclosures are related to an MOCVD apparatus in which two gas sources are separately introduced into a reactor chamber and spouted from plural distributed nozzles or branched vent pipes and mixed in the neighborhood of the substrate. These disclosures have a main object of avoiding a mutual reaction between two source material gases before they are spouted into the reactor chamber. However, there still remain problems of making the gas flow rate, the mixing ratio of gases, the density of the mixed gas, etc. more uniform.

SUMMARY OF THE INVENTION

It is a general object of the invention to provide an MOCVD apparatus for growing a compound semiconductor layer on a substrate with a hitherto unobtainable degree of uniformity.

It is a more specific object of the invention to provide an MOCVD apparatus for growing a compound semiconductor layer with a superior degree of uniformity in a thickness of the grown compound semiconductor layer over an entire surface of the substrate.

It is another object of the invention to provide an MOCVD apparatus for growing a compound semiconductor layer with a superior degree of uniformity in composition of the grown compound semiconductor layer over an entire surface of the substrate.

It is still another object of the invention to provide a method of growing a semiconductor layer utilizing the above-described MOCVD apparatus for obtaining superior uniformity in thickness and composition of the grown compound semiconductor layer.

It is a further object of the invention to provide the above method of growing a compound semiconductor layer, in which the growing process is automatically controlled.

According to the present invention, these and other objects and advantages are achieved by an MOCVD apparatus, in which a semiconductor substrate in a reactor chamber is rotated around its central axis. The substrate surface is arranged perpendicular to a direction of a plurality of vent pipes, so that the diluted source material gas is spouted out substantially vertical to the substrate surface, and the gas flow rate through each vent pipe is made to be adjustable or controllable. Further improvement of the apparatus can be achieved by adding a control mechanism for the dilution rate of the source material gas flowing through each vent pipe.

Further objects and advantages of the present invention will be apparent from the following description, reference being had to the accompanying drawings wherein preferred embodiments of the present invention are clearly shown.

BRIEF DESCRIPTION OF THE DRAWINGS

FIGS. 7(a) and 7(b) are perspective views of the vent pipes of the first embodiment and a third embodiment, respectively;

FIG. 8 is a gas flow diagram for a fourth embodiment of the present invention;

DETAILED DESCRIPTION OF THE PREFERRED EMBODIMENTS

Figure 1:
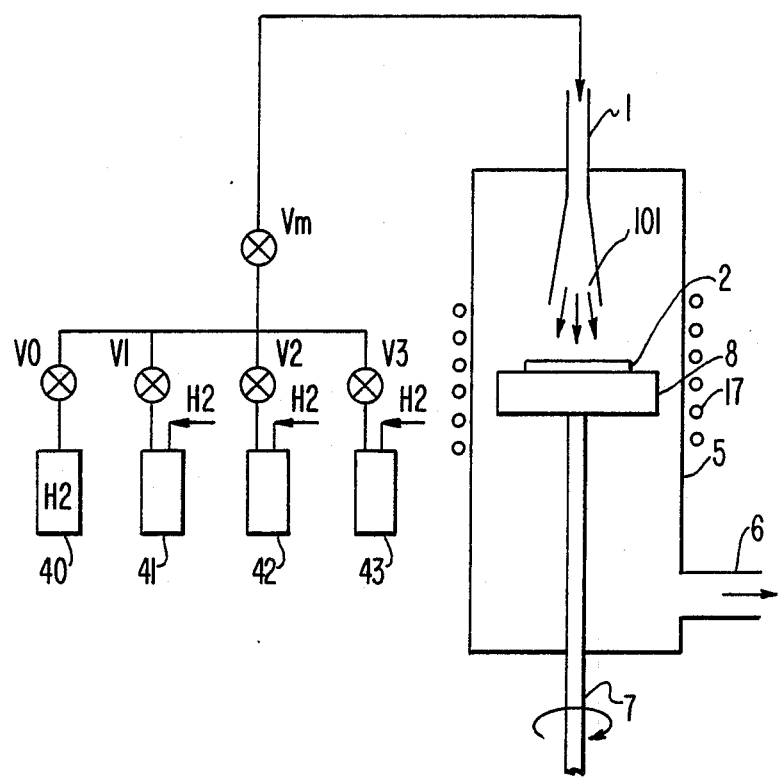
FIGS. 1 and 2 are schematic cross-sectional views of a reactor chamber and a gas flow diagram of an MOCVD apparatus of the prior art, wherein two different structures of a vent pipe are shown respectively.
Figure 2:
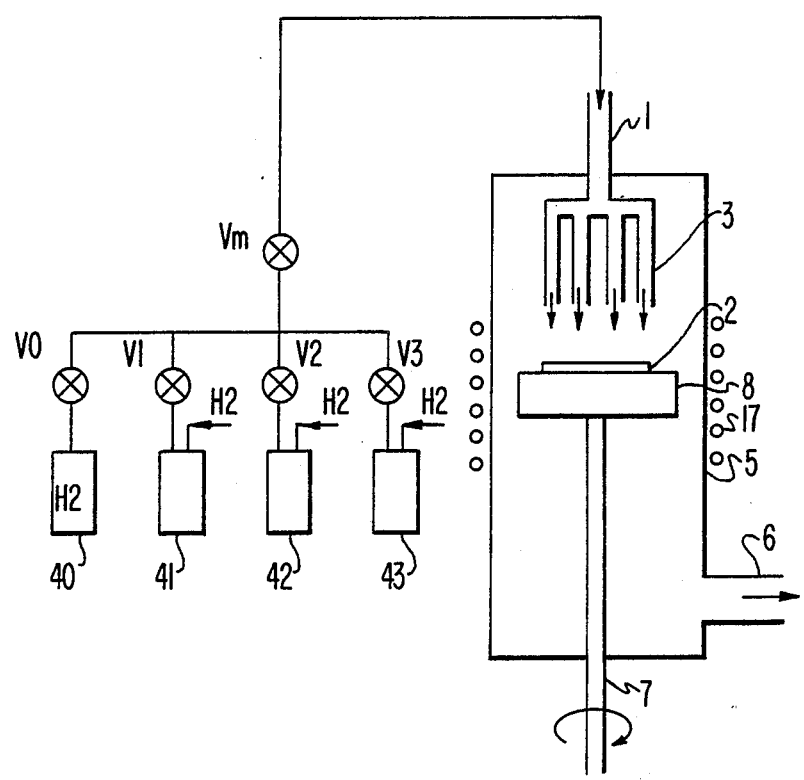

In the following explanation of the embodiments, same or like reference numerals designate same or corresponding parts previously used in FIGS. 1 and 2.

Figure 3:
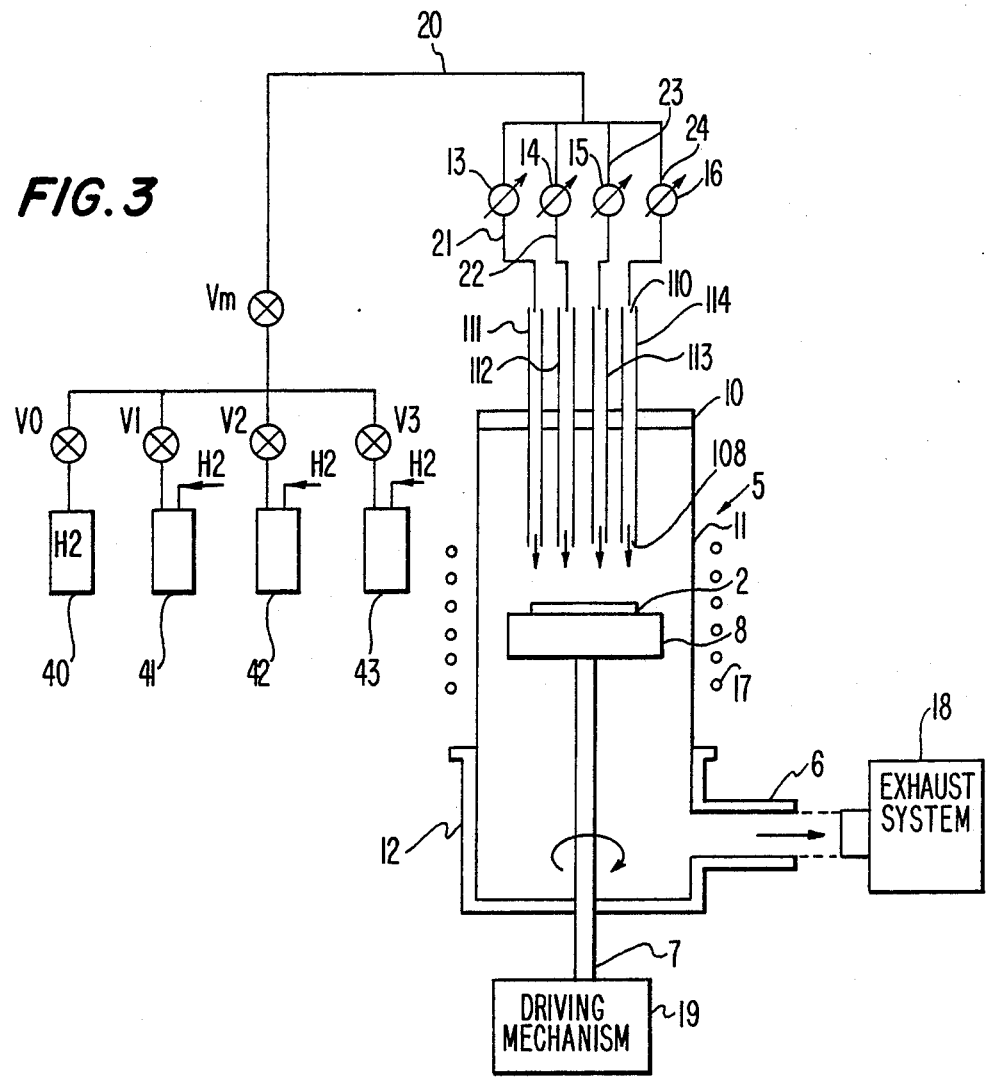
FIG. 3 is a schematic cross-sectional view of a reactor chamber and a gas flow diagram of an MOCVD apparatus of the first embodiment in accordance with a present invention.

FIG. 3 is a schematic gas flow diagram including a cross section of a reactor chamber of the first embodiment according to the present invention. A cylindrical body 11 of a reactor chamber 5 is made of quartz glass and has a diameter of, for example, about 100 mm. The reactor chamber 5 has a metal cover 10 of stainless steel at an upper end portion of the cylindrical body 11 and the cover 10 is sealed with the body. A plurality of vent pipes 111 to 114 is sealed with the cover 10 using an O-ring (not shown), penetrating therethrough and being vertical thereto, the seal position being aligned in a diametrical direction of the cover 10. In FIG. 3, vent pipes are illustrated in a way that there is a gap between two vent pipes. In an actual structure, however, there is almost no gap when the vent pipes having an inside diameter of 8 mm are pitched at an equal distance of 10 mm. A perspective view of the vent pipes is shown in FIG. 7(a).

Spouting ends 108 Of the vent pipes are facing toward a substrate 2 at a distance of about 50 mm therefrom. The semiconductor substrate 2, on which a compound semiconductor layer is to be grown, is loaded on a susceptor 8 of sintered carbon, having a diameter of about 70 mm.

The lower end portion of the cylindrical body 11 is sealed to a base member 12 of stainless steel using an O-ring (not shown), and an exhaust outlet 6 is provided on a side wall of the base member 12. The outlet 6 is connected to an exhaust system 18 when a low pressure MOCVD method is utilized. The susceptor 8 is supported by a support rod 7, which penetrates through a bottom portion of the base member 12 and is rotatable airtightly around its axis utilizing an O-ring or a fluid magnetic seal (not shown). The support rod 7 is rotated by a driving mechanism 19 during the operation.

The special feature of the present invention is characterized in a gas supply system for supplying source material gases and a dilution gas into the reactor chamber. In FIG. 3, four vent pipes 111 to 114 of quartz glass are arranged in a line and penetrate through the cover 10, and are sealed thereto. Gas flow controlling valve 13 to 16 are provided at an upstream position between a main pipe 20 and each inlet end 110 of the vent pipes 111 to 114. The main pipe feeds the diluted mixed source material gas, the flow thereof being closed or opened by a main valve $V_m$. The main valve $V_m$ is connected to a dilution gas source 40 and source material gas sources 41, 42, and 43. In FIG. 3, these gas sources are schematically illustrated.

Figure 4:
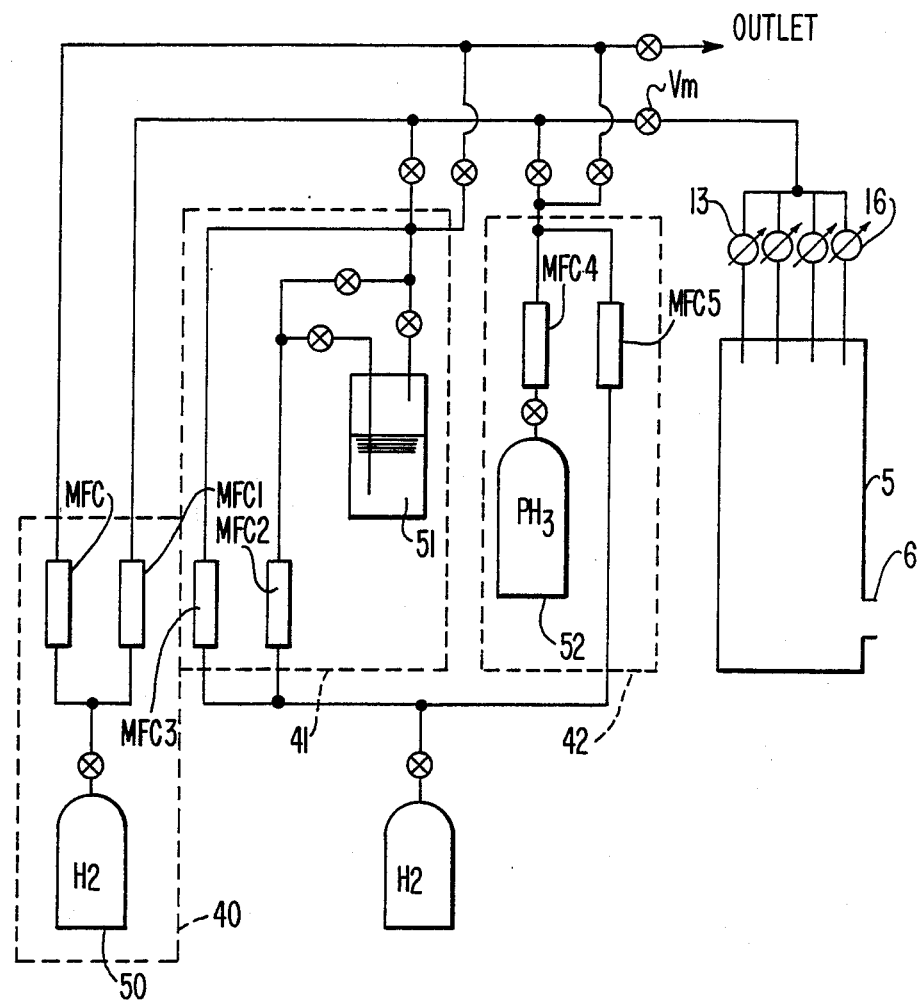
FIG. 4 is, a schematic diagram of a gas source system used in the present invention.

For a simple case when InP is grown on a binary substrate InP, an actual gas source system is shown in FIG. 4. A dilution gas source 40 includes a bombe 50 containing a hydrogen ($H_2$) gas and its flow rate is controlled by a mass flow controller $MFC_1$ mass flow controller, hereinafter, is abbreviated as MFC). An indium gas source 41 includes a bubbler 51 containing trimethylindium ($In(CH_3)_3$), which is bubbled by a hydrogen ($H_2$) gas introduced through a mass flow controller $MFC_2$, and the hydrogen ($H_2$) gas transports trimethylindium ($In(CH_3)_3$) vapor and is further mixed with a hydrogen ($H_2$) gas supplied through a mass flow controller $MFC_3$. A phosphorus gas source 42 includes a bombe 52 containing a phosphine ($PH_3$) gas, and is fed through a mass flow controller $MFC_4$ and further mixed with a hydrogen gas supplied through a mass flow controller $MFC_5$.

A metal organic gas containing vapor of, for example, trimethylindium ($In(CH_3)_3$), trimethylgallium ($Ga(CH_3)_3$), or trimethylaluminum [$Al(CH_3)_3$] easily reacts with a metal hydride gas of, for example, phosphine ($PH_3$), or arsine ($AsH_3$) in a heated atmosphere, and deposits a compound on a substrate. However, in order to deposit a compound semiconductor layer having a uniform thickness and composition, the method of introducing these gases into a reactor chamber is an important problem. Generally, a hydrogen dilution gas source such as denoted by 40 is provided separately in order to obtain a uniformity of a mixed source material gas. On the other hand, an object of introducing a hydrogen gas into each material gas source 41 to 43 such as shown in FIGS. 3 and 4 is to bubble a metal organic source or mix an output from the bombe in order to obtain a precise flow rate of the source material gas by making the gas flow velocity faster.

Though only three gas sources are illustrated in FIG. 4, other source material gases are added in the gas source system when necessary. For example, a gallium gas source is prepared in a bubbler containing trimethylgallium ($Ga(CH_3)_3$) or triethylgallium ($Ga(C_2H_5)_3$) bubbled with a hydrogen gas, and an arsenic gas source is prepared in a bombe containing an arsine ($AsH_3$) gas.

When an InGaP or InGaAs layer is grown on a GaAs or InP substrate respectively, the gas source system comprising three material gas sources and the dilution gas source is provided, three material gas sources being selected among the gallium, indium, arsenic and phosphorus gas sources, and these source material gases are mixed and diluted with the hydrogen dilution gas, and thereafter used. While feeding the above diluted mixed source material gas into the reactor chamber, the GaAs or InP substrate loaded on the susceptor 8 is rotated at a speed of about 60 rpm, and is heated up by a high frequency induction coil 17 disposed outside the reactor chamber 5. The substrate temperature is raised up to about 650°C.

In the first embodiment, the main pipe 20 is branched into four pipes 21 to 24, where the diluted and mixed source material gas is divided into four pipes. The gas flow rate through each branch pipe is controlled by a gas flow controlling valve 13 to 16. The gas flow controlling valve in FIG. 3 is shown by a simplified symbol, however, in an actual application, a combination of a needle valve and a mass flow meter, or a mass flow controller (MFC) is utilized. The gas flow rate in each branch pipe is determined in a manner that the grown semiconductor GaAsP or InGaAs layer has a uniform thickness and composition to the extent possible. Therefore, the gas flow rate changes depending on the kinds of gases, the temperature of the substrate, the pressure in the reactor chamber, etc. For example, the gas flow rate through branch pipes 21 and 24 is maintained at 1500 SCCM (standard cubic centimeters per minute) and the gas flow rate through branch pipes 22 and 23 is maintained at 1000 SCCM. This is because the gas flow rate toward the peripheral portion of the circular substrate surface should be larger than that toward the central portion thereof for obtaining uniform thickness.

Figure 5A:
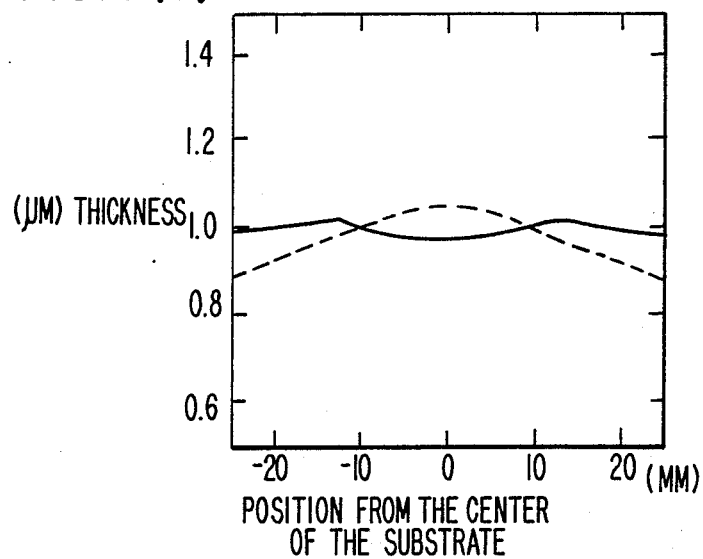
FIGS. 5(a) and 5(b) are graphs showing a comparison test result on the thickness and x-value, respectively, in growing a GaAsP layer on a substrate, wherein a solid curve shows the data obtained by the present invention and a dashed curve shows the data obtained by the prior art technology.
Figure 5B:
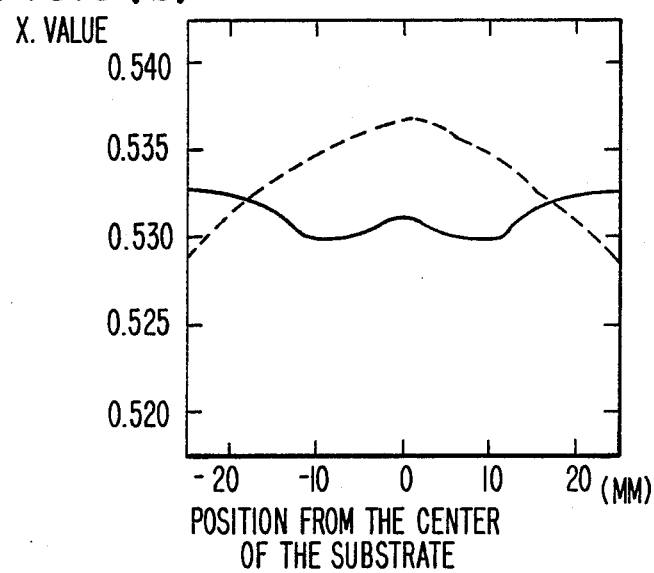

One test result is shown in FIGS. 5(a) and 5(b). An InGaAs layer having 1 μm thickness is grown on an InP substrate of 50 mm in diameter FIG. 5(a) shows a thickness fluctuation along the diametrical direction, and FIG. 5(b) shows a fluctuation of composition along the diametrical direction, in which x denotes a mixing ratio of the mixed compound semiconductor InGaAs when it is represented by a formula $In_{1-x}Ga_xAs$. In the two figures, a dashed curve represents a test result of the grown InGaAs layer obtained by the prior art method, and a solid curve represents a test result according to the above embodiment.

As shown in FIG. 5(a), the fluctuation in thickness ranging from +10% to −10% in the prior art is reduced to within a ±3% range by utilizing the MOCVD apparatus of the first embodiment. And further as shown in FIG. 5(b), when the $In_{1-x}Ga_xAs$ layer is grown with the aim of obtaining x=0.53, the fluctuation of x-value is improved from about a ±10% range to a ±3% range. This shows a remarkable improvement is achieved in uniformity of the composition.

Figure 6:
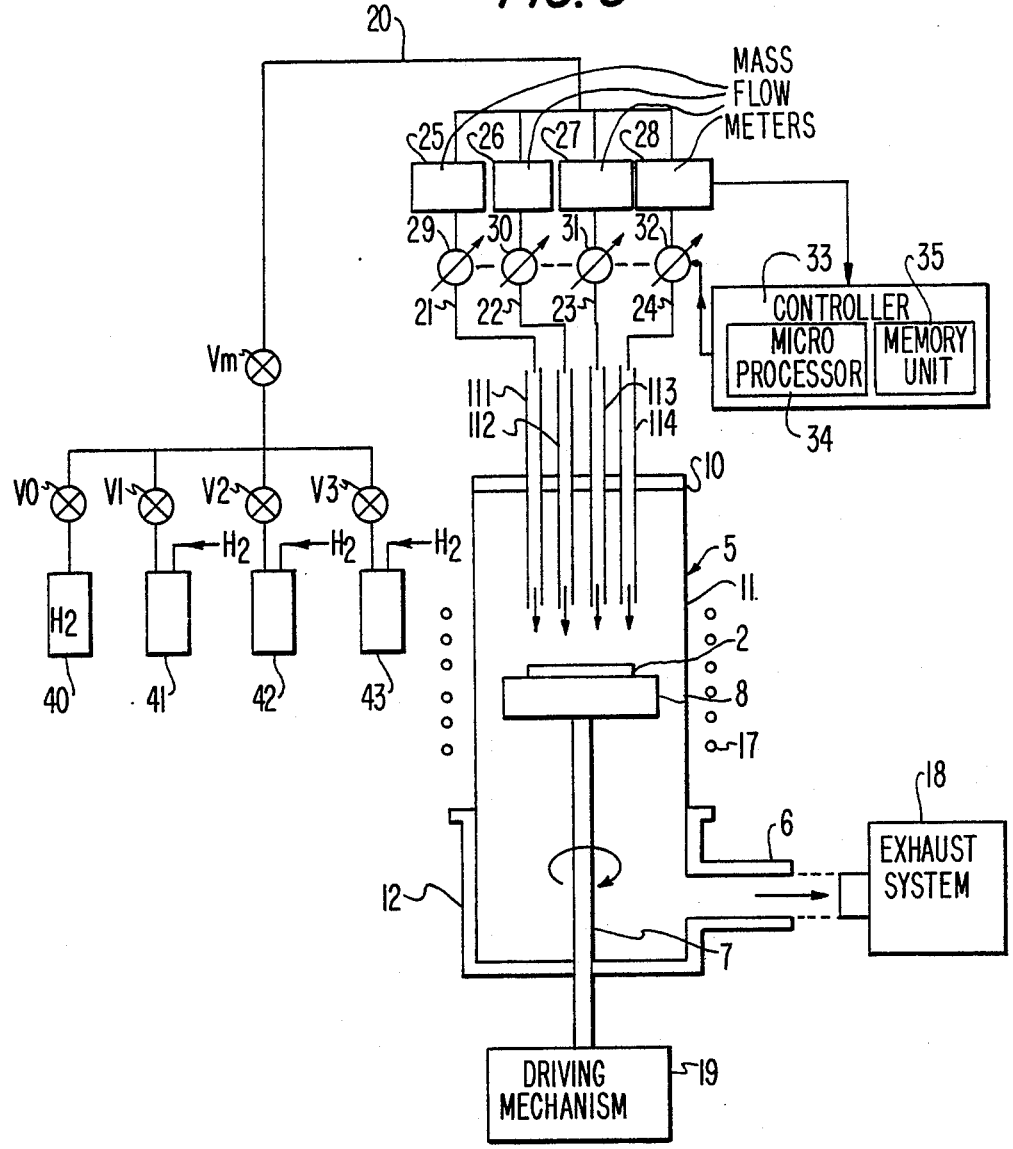
FIG. 6 is a schematic cross-sectional view of the second embodiment of the present invention, in which each gas flow through the vent pipe is automatically controlled by a controller.

FIG. 6 is a schematic gas flow diagram including a schematic cross section of a reactor chamber of the second embodiment of the present invention. Most of the structure is similar to that shown in FIG. 3, except that an automatic gas flow control system is added to the gas flow passages of branch pipes 21 to 24. In FIG. 6, mass flow meters 25 to 28 and flow adjusting valves 29 to 32 such as a needle valve, which is movable by an electric signal, are inserted in the branch pipe 21 to 24, respectively. Moreover, a controller 33 comprising a microprocessor 34 and a memory unit 35, is operatively connected to each of the above described mass flow meters 25-28 and flow adjusting valves 29-32. Each combination of a mass flow meter and a flow adjusting valve can be replaced by an MFC, which has a function of controlling and maintaining a gas flow rate at a predetermined value. The memory unit 35 stores the necessary data for the gas flow rate in each branch pipe, the required growth time in each step, etc. With a start command to the controller 33, the microprocessor 34 begins to read the data stored in the memory unit 35, compares the read out data with the measured flow rate in each branch pipe and controls the gas flow rate to the predetermined data.

In the above first and second embodiments, all source material gases and the hydrogen dilution gas are mixed and diluted in the gas source system and thereafter divided and fed to each branch pipe. However, when the mixed gas is flowing through the main pipe 20 or branch pipes at a very low velocity, which is often encountered in a normal pressure MOCVD method, the mixed gas is liable to react mutually even when flowing through the pipe. This can result in deposits being formed on the inside wall of the pipes.

In the third embodiment which prevents the above reaction of the mixed gas within the gas supply system, one source material gas, which readily reacts with other source material gas, is supplied separately in another gas supply system. In this case, the above reactive source material gas is spouted out separately from another set of vent pipes into the reactor chamber. FIG. 7(a) is a schematic perspective view of the vent pipes 111 to 114 fixed to the cover 10 shown in FIG. 3, which is disclosed previously, and FIG. 7(b) is a similar view of the third embodiment when an additional set of vent pipes 111a to 114a is provided.

FIG. 8 is a schematic gas flow diagram of the fourth embodiment of the present invention. There is no change in the other parts of the MOCVD apparatus except the gas supply system; therefore, only the gas flow diagram is shown in the figure. A gas source system 36 comprises a dilution gas source 40 and plural source material gas sources which are illustrated simply by a mixed material gas source 37 in FIG. 8. However, an outlet of the dilution gas source 40 is not connected directly to the main pipe as shown in FIG. 3, but separately connected to a dilution gas supply pipe 38. The outlet of the mixed material gas source 37 is connected to a material gas supply pipe 39. The dilution gas supply pipe 38 is branched into four dilution gas branch pipes 71 to 74. The material gas supply pipe 39 is also branched into four material gas branch pipes 61 to 64. In each branch pipe line 61 to 64 and 71 to 74, a mass flow controller denoted as $MFC_{61}$ to $MFC_{64}$ and $MFC_{71}$ to $MFC_{74}$ is inserted. Further, each end of the dilution gas branch pipes 71 to 74 is connected together with each respective outlet side of $MFC_{61}$ to $MFC_{64}$ in the material gas branch pipes 61 to 64. The material gas branch pipes 61 to 64 are finally connected to respective vent pipes 111 to 114.

When an InP layer, for example, is grown on a substrate, the mixed material gas source 37 supplies a mixed gas of trimethylindium ($In(CH_3)_3$) and phosphine ($PH_3$), having a mixing ratio of 1:100. The dilution gas source 40 supplies a hydrogen ($H_2$) dilution gas. These two gases flow separately through the dilution gas supply pipe 38 and material gas supply pipe 39, and each gas flow is branched into four branch pipes. The flow rate in each branch pipe is precisely controlled by the MFC inserted in the branch pipe. It is known that the growth rate of InP layer on the substrate is proportional to a concentration of the source material gas, in this case, trimethylindium ($In(CH_3)_3$) and a square root of the velocity of gas flow on the substrate surface. In this embodiment, it becomes possible to control these two factors more precisely and individually.

Figure 9:
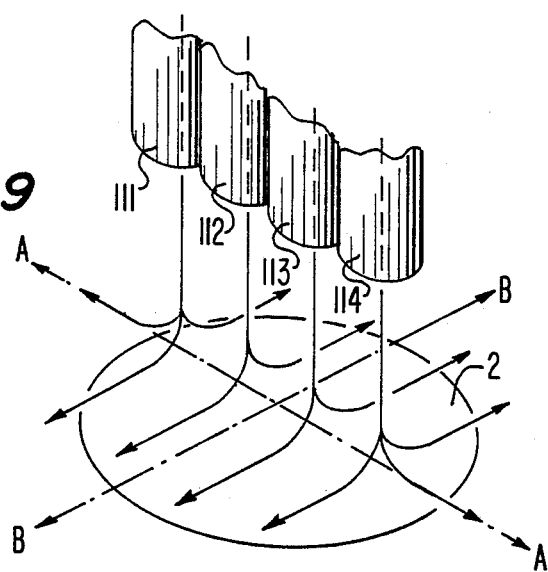
FIG. 9 is a diagram illustrating gas flow paths from the vent pipes onto the substrate.
Figure 10:
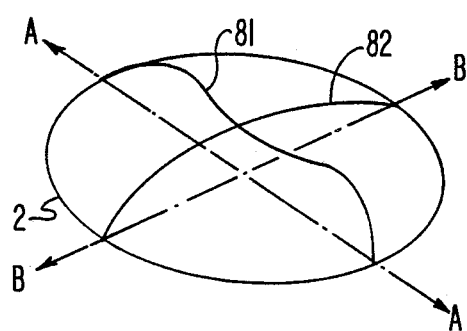
FIG. 10 is a diagram illustrating schematically a thickness distribution of the grown semiconductor on the substrate according to the present invention, assuming that the substrate is stationary with regard to the reactor chamber.

FIG. 9 illustrates the path of the gas flow schematically in the region from the spouting ends of the vent pipes 111 to 114 onto the substrate 2. The concentration of trimethylindium ($In(CH_3)_3$) in the diluted mixed gas through two vent pipes 111 and 114 disposed on opposite sides is chosen to be higher than the concentration through vent pipes 112 and 113 disposed in the center. Assuming that the substrate 2 is made stationary with regard to the vent pipes 111 to 114, the growth rate of the semiconductor InP on the substrate is schematically shown by the curves 81 and 82 in FIG. 10. The direction A—A in FIG. 10 corresponds to the direction A—A in FIG. 9. Along the direction A—A, the growth rate on the peripheral portion of the substrate is higher than that along the central portion thereof. Along the direction B—B, which is perpendicular to A—A, however, the growth rate on the peripheral portion is lower than that along the central portion. When the substrate 2 is rotated around the central axis, maintaining the condition that the gas flow rates through two vent pipes 111 and 114 are higher than those through two vent pipes 112 and 113, a very uniform growth rate on the entire surface can be achieved. Test results for growing the InP layer having a thickness of 2 $\mu m$ show that a thickness fluctuation within a 2 $\mu m \pm 0.02$ $\mu m$ range can be obtained, which is a remarkable improvement compared with the results of 2 $\mu m \pm 0.06$ $\mu m$ range of the prior art.

Throughout the explanation of the preferred embodiments, four branch pipes and four vent pipes are used and illustrated, and vent pipes are aligned in a line vertical to the substrate, with spouting ends thereof facing toward the substrate and disposed symmetrically with regard to the center of the substrate.

However, the present invention may be embodied in other specific forms of the gas supply system without departing from the spirit or essential characteristics thereof. The number of branch pipes and vent pipes is not limited to a specific number such as four and, moreover, vent pipes are not limited to an arrangement in a line. Spouting ends of vent pipes may be arranged two-dimensionally, or unsymmetrically with regard to the center of the substrate surface.

The presently disclosed embodiments are, therefore, to be considered in all respects as illustrative and not restrictive, the scope of the invention being indicated by the appended claims, rather than the foregoing description, and all changes which come within the meaning and range of equivalency of the claims are therefore, to be embraced therein.

What is claimed is:

1. A metal organic chemical vapor deposition method for growing a compound semiconductor layer on a substrate, comprising steps of:
    disposing the substrate in a reactor chamber, the substrate being loaded on a support and rotated around the center axis of the substrate;
    heating the substrate by a heating apparatus disposed outside the reactor chamber;
    flowing a mixed gas into the reactor chamber through a plurality of vent pipes, and releasing the used mixed gas through an exhaust outlet to the outside of the reactor chamber, the mixed gas being spouted out onto the substrate surface substantially vertical thereto, the mixed gas comprising at least a metal organic gas and a reactive gas which reacts with the metal organic gas; and
    separately controlling the gas flow rate through each of the vent pipes, so that there is a difference between the gas flow rates through one of the vent pipes facing the center region of the substrate and through one of the vent pipes facing the peripheral region of the substrate.

2. A metal organic chemical vapor deposition method according to claim 1, wherein the mixed gas further comprises a dilution gas which is inactive with respect to other gases forming the mixed gas.

3. A metal organic chemical vapor deposition method for growing a compound semiconductor layer on a substrate having a surface, comprising steps of:
    disposing the substrate in a reactor chamber, the substrate being loaded on a support and rotated around the center axis of the substrate;

heating the substrate by a heating apparatus disposed outside the reactor chamber;

flowing first and second kinds of gas into the reactor chamber through first and second groups of vent pipes, respectively, and releasing the used gases through an exhaust outlet to the outside of the reactor chamber, the first and second kinds of gas both being spouted out vertically onto the substrate surface, the first kind of gas comprising a metal organic gas and the second kind of gas comprising a reactive gas which reacts with the metal organic gas, the first and second groups of vent pipes having substantially the same number of vent pipes which is at least two, each vent pipe of the first group being arranged adjacent to a corresponding vent pipe of the second group; and separately controlling the gas flow rate through each of the vent pipes, so that a mixing ratio of the first kind of gas to the second kind of gas spouted onto the substrate is controlled to produce a difference between the gas flow rates through one of the vent pipes facing the center region of the substrate and through one of the vent pipes facing the peripheral region of the substrate, the difference in the gas flow rates being sufficient to produce a uniform grown semiconductor layer.

4. A metal organic chemical vapor deposition method according to claim 3, wherein the first and second kinds of gas each includes a dilution gas which is inactive with respect to the other gases forming the corresponding one of the first and second kinds of gas.

5. A metal organic chemical vapor deposition method for growing a compound semiconductor layer on a substrate having a surface, comprising steps of:

disposing the substrate in a reactor chamber, the substrate being loaded on a support and rotated around the enter axis of the substrate;

heating the substrate by a heating apparatus disposed outside the reactor chamber;

flowing a diluted mixed gas into the reactor chamber through a plurality of vent pipes and releasing the used gases through an exhaust outlet to the outside of the reactor chamber, the diluted mixed gas being spouted out from the vent pipes substantially vertically onto the substrate surface, the diluted mixed gas being formed by mixing a mixed gas and a dilution gas supplied through first and second sets of branch pipes, respectively, both of the first and second sets of branch pipes having the same number of branch pipes as the number of vent pipes, and the mixed gas including a metal organic gas and a reactive gas which reacts with the metal organic gas; and separately controlling the gas flow rate through each of the branch pipes, so that a concentration of the mixed gas in the diluted mixed gas is controlled and there is a difference between the gas flow rates through one of the vent pipes facing the center region of the substrate and through one of the vent pipes facing the peripheral region of the substrate.

6. A metal organic chemical vapor deposition method according to claim 5, wherein the dilution gas is a hydrogen gas.

* * * * *

UNITED STATES PATENT AND TRADEMARK OFFICE
CERTIFICATE OF CORRECTION

PATENT NO. : 4,980,204

DATED : DECEMBER 25, 1990

INVENTOR(S) : TAKUYA FUJII ET AL.

It is certified that error appears in the above-identified patent and that said Letters Patent is hereby corrected as shown below:

Col. 2, line 3, "[AsH$_3$]" should be --(AsH$_3$)--;

line 4, "[PH$_3$]" should be --(PH$_3$)--;

line 64, "al. SHO" should be --al.; and SHO--.

*Col. 3, line 59, "apparatus of the first embodiment in accordance with a" should be --apparatus in accordance with a first embodiment of the--;

line 61, "is," should be --is--.

Col. 4, line 63, "valve" should be --valves--.

Col. 5, line 23, "[Al(CH$_3$)$_3$]" should be --(Al(CH$_3$)$_3$)--;

line 32, "a" (first occurrence) should be deleted.

Signed and Sealed this

Eighteenth Day of August, 1992

Attest:

DOUGLAS B. COMER

*Attesting Officer*    Acting Commissioner of Patents and Trademarks